United States Patent [19]
Johnson et al.

[11] Patent Number: 5,994,939
[45] Date of Patent: Nov. 30, 1999

[54] VARIABLE DELAY CELL WITH A SELF-BIASING LOAD

[75] Inventors: Luke A. Johnson, Tempe; Timothy E. Fiscus, Chandler, both of Ariz.

[73] Assignee: Intel Corporation, Santa Clara, Calif.

[21] Appl. No.: 09/006,649

[22] Filed: Jan. 14, 1998

[51] Int. Cl.⁶ .............................. H03K 5/13; H03K 17/28
[52] U.S. Cl. ........................... 327/280; 327/287; 327/65; 327/563; 330/257
[58] Field of Search ..................................... 327/280, 287, 327/266, 274, 562, 563, 65, 66; 330/257, 254, 261; 331/34, 57

[56] References Cited

U.S. PATENT DOCUMENTS

| | | | |
|---|---|---|---|
| 4,866,314 | 9/1989 | Traa | 327/280 |
| 5,422,529 | 6/1995 | Lee | 327/536 |
| 5,546,052 | 8/1996 | Austin et al. | 331/57 |
| 5,576,647 | 11/1996 | Sutardja et al. | 327/108 |

OTHER PUBLICATIONS

"Comparator with Hysteresis," Allen, Phillip E., and Holberg, Douglas R., *CMOS Analog Circuit Design*, 1987, pp. 349–352.

*Primary Examiner*—Terry D. Cunningham
*Assistant Examiner*—Eunja Adolphe
*Attorney, Agent, or Firm*—Blakely, Sokoloff, Taylor & Zafman LLP

[57] ABSTRACT

A variable delay cell with a self-biasing load suitable for the implementation of a voltage controlled oscillator and other functions. Because the invention employs current steering between symmetric loads and fully differential voltage control, it is very fast relative to conventional methods and has reduced jitter and improved power supply noise rejection. Additionally, since the load is self-biasing, the need to externally generate a bias current for the load is eliminated. This significantly simplifies design. Also as the load readily self biases in response to changes in the bias current of the biasing transistor, desirable functionalities can be achieved merely by appropriately changing the bias current into the biasing transistor. Notably, the slew rate of both the rising and falling edge can be controlled in this way. Because the load provides a fully differential output, noise immunity as well as a 50% duty cycle is readily achieved.

20 Claims, 7 Drawing Sheets

VARIABLE DELAY CELL WITH A SELF-BIASING LOAD

BACKGROUND OF THE INVENTION

(1) Field of the Invention

The invention relates to electronic circuit design. More specifically, the invention relates to a variable delay cell with self-biasing load for use in obtaining a differential output signal.

(2) Related Art

For purposes of noise reduction it is often desirable to use differential rather than a single-ended signaling. For a gain device such as an op amp using a differential pair since high gain is desired, a high impedance load is necessary. Additionally, the load must be chosen such that the voltage drop across the load transistors of the differential pair is not so high that the differential pair goes into the triode region of operation. This has typically been accomplished using current sources as the loads on each leg of the differential pair. For example, a transistor with a suitable externally generated bias current applied to its gate so that the transistor remains in saturation acts as an approximately constant current source. Thus, two transistors with their gates appropriately biased, source current and provide a high impedance load. However, the generation of the bias current applied to the gates must be very accurate to keep the load transistors and differential pair transistors in saturation.

FIG. 1 is a schematic diagram of a prior art variable delay cell. A differential pair 1 receives a differential input voltage at its gates. A second differential pair 2 receives a differential control signal at its gates. One of the transistors of differential pair 2 has its drain coupled to the sources of the first differential pair. The second transistor of differential pair 2 has its drain coupled to the sources of a pair of cross-coupled transistors which in turn are coupled to the drains of the first differential pair 1. Biasing transistor 4 is driven by an externally supplied NBIAS voltage and controls the amount of current drawn through the second differential pair 2. A second biasing transistor 3 is coupled to the sources of the first differential pair 1 and ensures that the transistors of the first differential pair 1 remain in the saturation region. The first differential pair 1 is loaded by a pair of diode-connected transistors 6 and a variable resistance created by the cross-coupled transistors 5. This embodiment varies the effective resistance seen by the first differential pair 1 through the use of positive feedback. Thus, current is varied between the amplifier and the cross-coupled transistors 5 to maintain a constant output swing. Unfortunately, using this approach, the differential control voltages are not symmetrical. Specifically, an increase in voltage on one control node will not adjust the frequency the same as a decrease in voltage on the other control node. This results in a non-linear gain curve for a voltage controlled oscillator (VCO) using these cells. One of ordinary skill in the art will recognize that linearity of the gain curve is very important in VCOs. Particularly, the linearity of the gain curve is directly related to jitter in the output signal of the VCO.

FIG. 2 is a schematic and block diagram of another prior art delay cell. A voltage to current converter 30 is used to create a control bias current (IBIAS) from an applied control voltage. This bias current is mirrored into the VCO stages through the use of the control voltage CTLBIAS. Voltage to current converter 30 employs a differential pair 31 biased by a biasing transistor 33 with an external NBIAS current applied to its gate. The differential pair 31 has differential control signal applied to its gates. Mirroring transistor 35 mirrors the current drawn through diode connected transistor 37. Transistor 36 is coupled to complete the configuration. This mirrored current IBIAS provides the biasing current for a delay stage 140. Unfortunately, the converter 30 introduces delay into the phase lock loop feedback loop from when the voltage changes to when the frequency changes. This has a negative effect on jitter and decreases the stability of the phase lock loop.

In delay stage 140 a differential pair 12 receives a differential input, IN and INZ. The differential pair 12 is coupled to a biasing transistor 13 which is governed by the bias voltage, CTLBIAS. The biasing transistor 13 acts as a current source pulling a current I through the differential pair to ground. Four transistors form the load 10. One diode connected transistor 21 and one non-diode connected transistor 11 is coupled along each leg of the differential pair 12. The impedance of load 10 dictates the amount of gain present at output nodes 14. The bias voltage LOADBIAS must be provided to the gate of non-diode connected transistors 11 such that transistors 11 remain in saturation at the switching point. The sum of the currents sourced through load 10 must equal I or at least one of the transistors will leave the saturation region. Because CTLBIAS is set so that transistor 13 is in saturation and delivering a current I, the two sides of the load must deliver I/2 at the switching point. If LOADBIAS is not precisely set, the two sides may source too much or too little current. As a result one or more of the transistors of the load or the differential pair will be forced out of saturation.

To ensure that the transistors of the delay stage remain in saturation a special circuit is required to insure that the load is correctly biased. In FIG. 2, to generate LOADBIAS, a bias generating circuit 150 is coupled to the gates of transistors 11 of the load 10. Bias generating circuit 150 is a differential amplifier with all transistors except the current source diode connected. The transistors are selected so that LOADBIAS will maintain the load in saturation for expected values of CTLBIAS. Higher speed signaling in the range of one to two gigahertz coupled with the tight jitter requirements of existing serial protocols makes it extraordinarily difficult to properly control CTLBIAS and LOADBIAS to satisfy these requirements. Specifically, this implementation is slow settling due to the delay in the voltage to current stage 30 and the delay in the biasing stage 150.

In view of the foregoing, it would be desirable to have a variable delay cell with symmetrical control voltage response and good jitter characteristics. It would also be desirable to be able to accomplish this with a highly flexible design that minimizes the delay in the PLL feedback loop by reacting quickly to a change in the control voltage (CTL and CTLZ) and is easily and cost-effectively implemented.

BRIEF SUMMARY OF THE INVENTION

A circuit to provide a differential delay cell signal is disclosed. An active side that has a self-biasing load employed with a pair of draw transistors coupled thereto is provided. The draw transistors draw current through the self-biasing load down a first leg and a second leg of the load responsive to a biasing transistor. An inactive side is also provided. The active and the inactive sides are coupled to a current steering circuit that dictates an amount of current drawn through each side responsive to a differential control input.

BRIEF DESCRIPTION OF THE DRAWINGS

FIGS. 3b–d are schematic diagrams for small signal analysis of the load of FIG. 3a.

DETAILED DESCRIPTION OF THE INVENTION

One embodiment of the invention provides a variable delay cell having a self-biasing load suitable for the implementation a voltage control cell. Because the load is self-biasing, the need to externally generate a bias current for the load is eliminated. This significantly simplifies design and improves the response time of the design. Additionally, because the load readily self biases in response to changes in the bias current of the biasing transistor desirable functionalities can be achieved merely by appropriately changing the bias current into the biasing transistor. Notably, the slew rate of both the rising and falling edge can be controlled in this way. Because the load provides a fully differential output common mode noise immunity as well as a 50% duty cycle is readily achieved.

Figure 1:
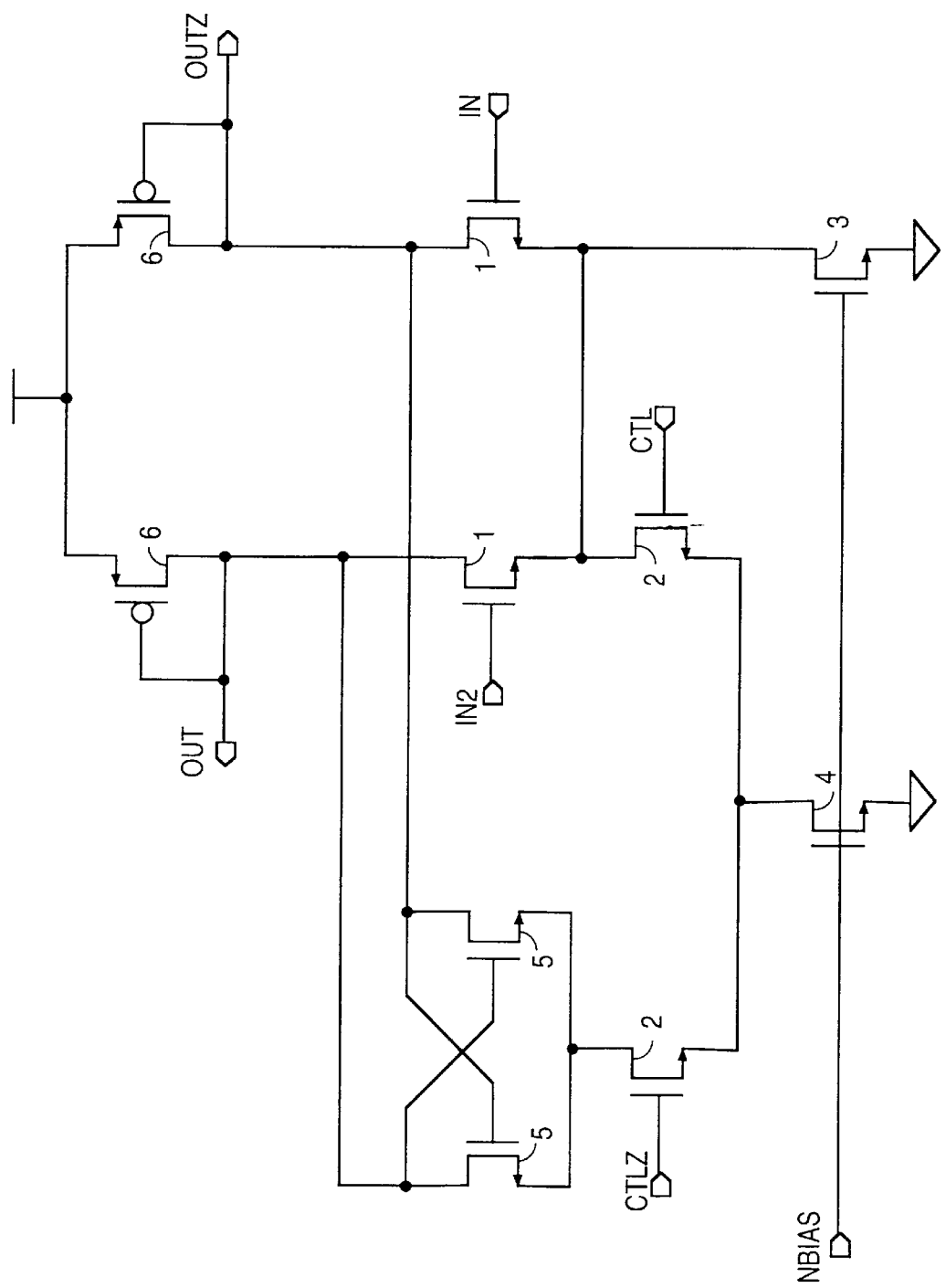
FIG. 1 is a schematic of a typical prior art differential delay circuit.
Figure 2:
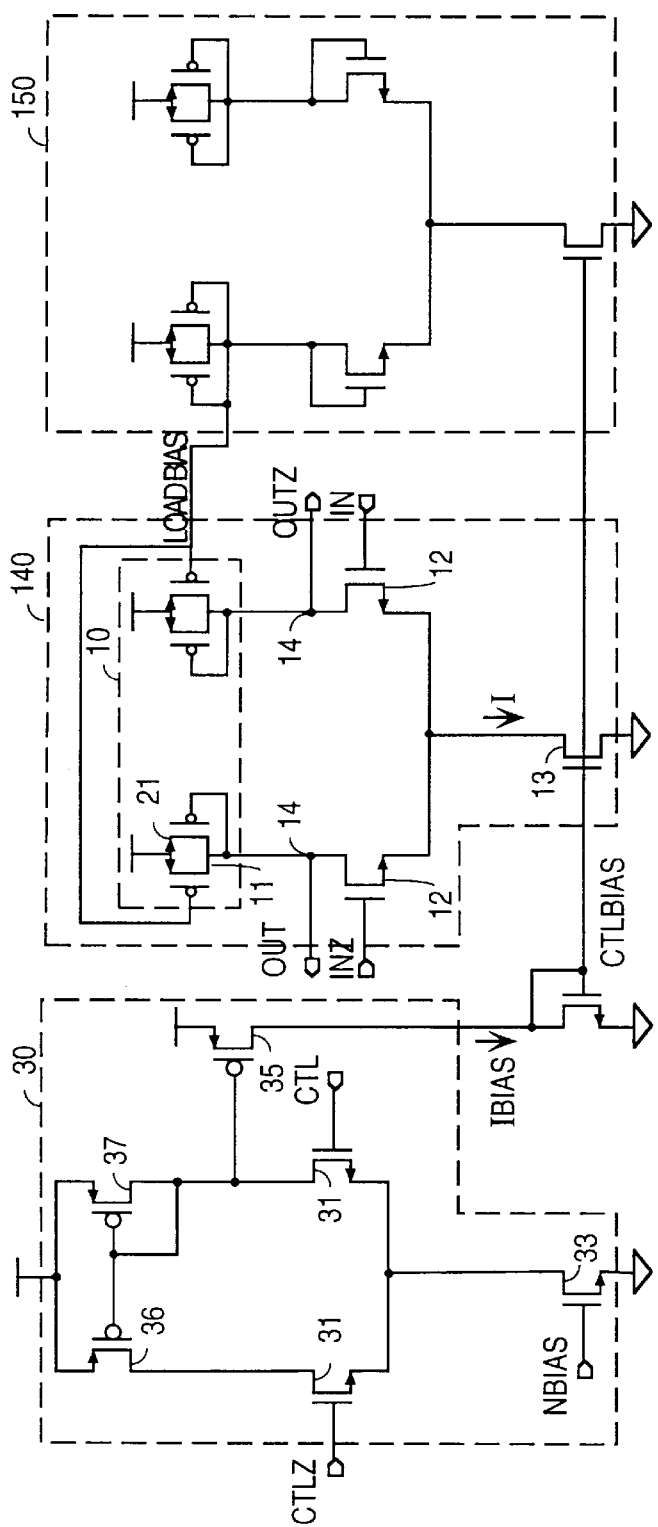
FIG. 2 is a schematic of a second prior art differential delay circuit.
Figure 3A:
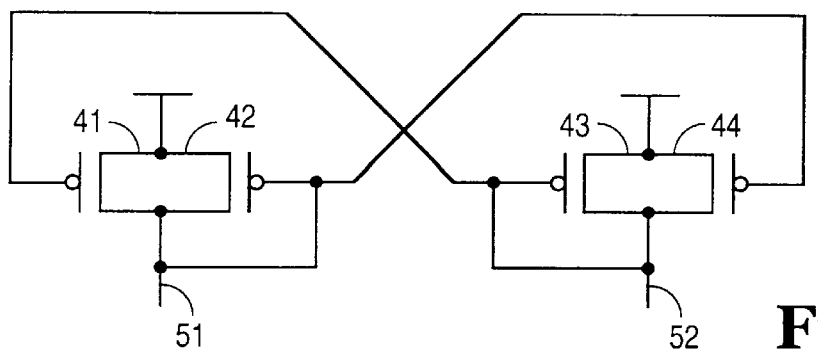
FIG. 3a is a schematic diagram of the load employed in variable delay cell of one embodiment of the invention.

FIG. 3a is a schematic diagram of the load for use in one embodiment of the invention. The first pair of transistors 41 and 42 are coupled together source to source and drain to drain with the sources coupled to the power supply. Similarly, the second pair of transistors 43 and 44 are coupled source to source and drain to drain with the sources coupled to the power supply. Transistors 42 and 43 are diode connected. Additionally, the gates of the 41, 44 are cross-coupled to the gate of the diode connected transistor 43, 42 on the other side of the load. Herein transistors 41 and 44 are referred to as cross coupled transistors and transistor 43 and 42 are referred to as diode connected transistors. Thus, the gate of diode connected transistor 42 is coupled to the gate of cross coupled transistor 44 and similarly the gate of diode connected transistor 43 is coupled to the gate of cross coupled transistor 41. A fully differential output voltage can be obtained between leg 51 and leg 52 of the load. Designers would generally disdain the use of diode connected transistors in the load because diode connected transistors typically result in low output impedances and, therefore, low gain. As is described below, this load configuration results in a high output impedance and correspondingly high gain.

Figure 3B:
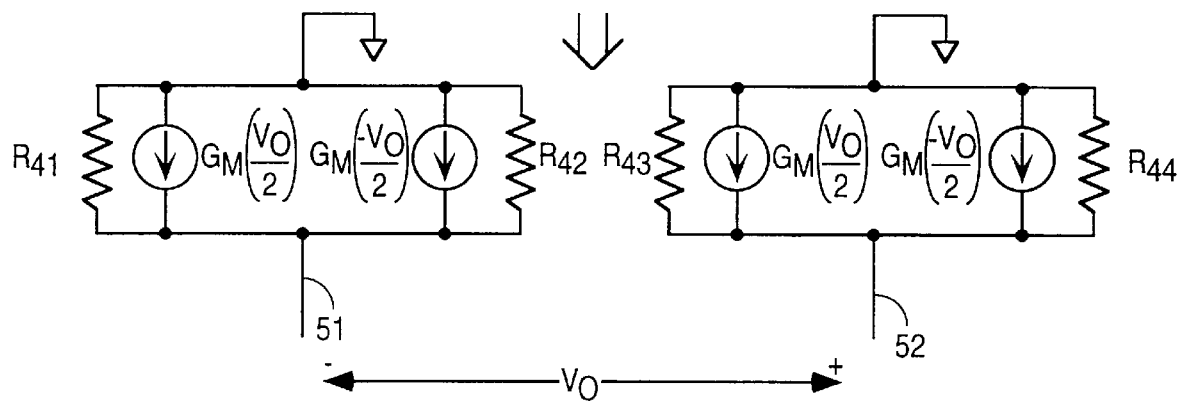
Figure 3C:
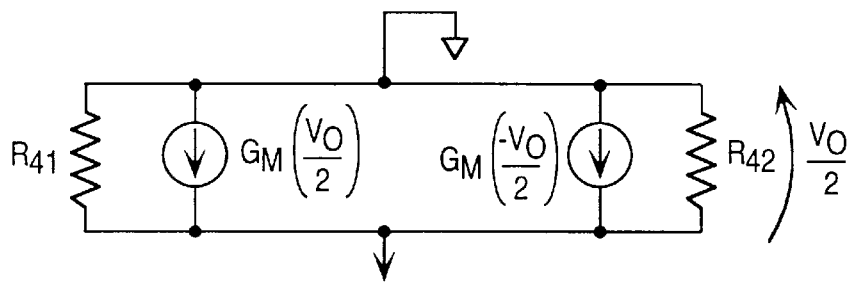
Figure 3D:
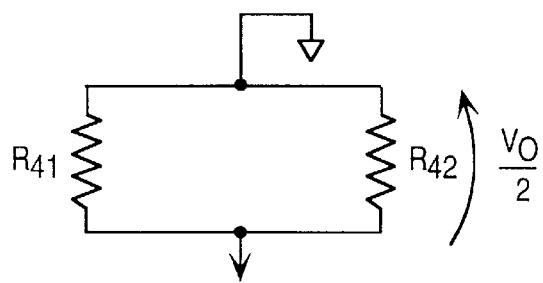

FIGS. 3b–d are schematic diagrams for small signal analysis of the load of FIG. 3a. Determining the load impedance ($R_L$) looking into the drains, the transistors are modeled as a resistor in parallel with a current source. Thus, $R_{41}$, $R_{42}$, $R_{43}$ and $R_{44}$ correspond to the output resistances respectively of transistors 41–44. The current sources output current equal to $G_m(Vin)$. Since Vin is the voltage across the current source, an equivalent impedance of 1/gm results. In this case, half of $V_o$ drops across each half of the load. Accordingly, $Vin=V_o/2$ for transistor 41 and $V_{in}=-V_o/2$ for transistor 42. FIGS. 3c and 3d represent only half the load, identical analysis would apply to the other half. Looking at FIG. 3c the current sources cancel yielding FIG. 3d which is merely $R_{41}$ in parallel with $R_{42}$. Thus, $R_{41}$ parallel with $R_{42}$ is the load impedance looking up one leg into the drains. Accordingly, a high load impedance is achieved and therefore high gain is possible.

Figure 4:
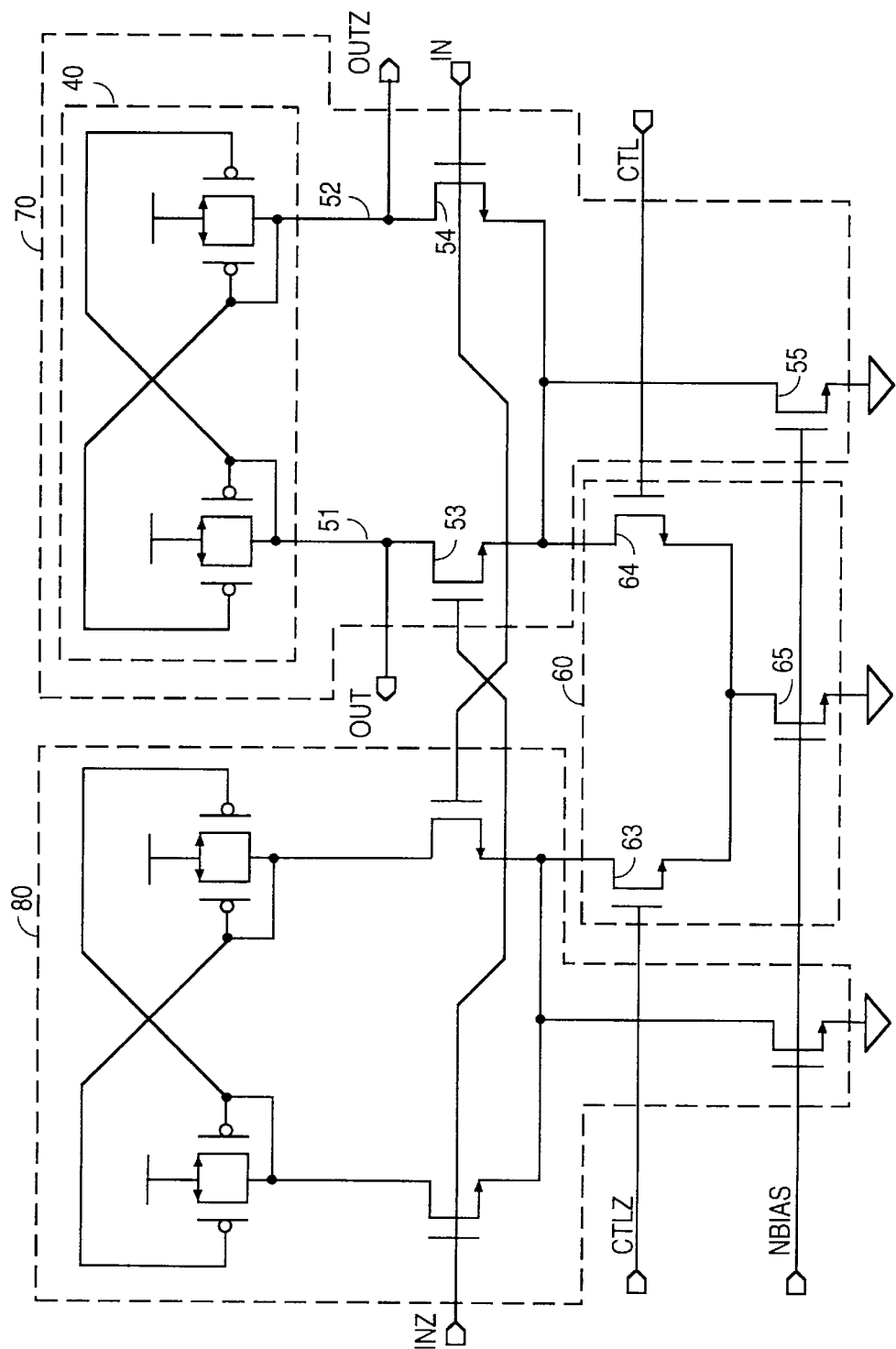
FIG. 4 is a schematic diagram of a delay cell of one embodiment of the invention.

FIG. 4 is a schematic diagram of a delay cell of one embodiment of the invention. The delay cell is comprised of three major blocks: an active side 70 an inactive side 80 and a current steering circuit 60. Current steering circuit 60 includes a differential pair 63 and 64 and a current source transistor 65. Control signals CTL and CTLZ drive the differential pair 63, 64 which in turn dictates the amount of current flowing through the active side 70 and inactive side 80 of the delay cell. By increasing the amount of current flowing through the active side of the delay cell switching speed of the output is increased. As more current flows through the active side of the circuit the output load capacitors (not shown) will charge more rapidly.

Active side 70 is a differential amplifier Legs 51 and 52 are coupled respectively to transistors 53 and 54 of the differential pair. Transistors 53 and 54 are draw transistors in the sense that they draw current down the legs 51 and 52 through the load 40. The load 40 comprises two pairs of transistors coupled source to source and drain to drain, one transistor of each pair being diode connected and the other being cross coupled. Each pair sits atop a leg 51, 52. The legs 51, 52 are the output nodes for the differential output. A biasing transistor 55 is coupled to the sources of the differential pair 53, 54. The biasing transistor 55 acts as an approximately constant current source as long as the bias voltage (NBIAS) is selected so that biasing transistor 55 remains in the saturation region. The current available to both legs 51, 52 is dictated statically by NBIAS and dynamically by CTL, CTLZ. The minimum current is achieved when CTL, CTLZ diverts all the current originating from current source transistor 65 to the inactive side 80; in this condition only the current supplied by biasing transistor 55 is drawn through the inactive side 80. The maximum current load (and thus speed) is achieved when CTL, CTLZ directs all of the current from current source transistor 65 into the active side 70. In this case current from biasing transistor 55 is summed with current from current source transistor 65.

Unlike the prior art, changes in NBIAS do not require redesign of the load since load 40 is self-biasing, the transistors of load 40 will remain in saturation region at the switching point over a broad range of NBIAS currents. Additionally, inasmuch as no external generation of PBIAS exists initial design is vastly simplified. Conveniently, the switching speed of the outputs can be controlled by changing NBIAS. Since, the output of the differential amplifier 50 will typically have a capacitive load, a change in the NBIAS current which increases the current flow down the legs of the differential amplifier will increase the switching speed of the output capacitive load. Notably, the circuit is fully differential thereby rejecting common mode noise. This is extremely important for an analog circuit operating next to, e.g. a digital microprocessor on the same substrate. The differential nature of the circuit also permits the design to maintain a 50% duty cycle since the two signals of the differential pair are 180° out of the phase and a change in state occurs at the cross point of the two signals, not when each reaches an unrelated threshold voltage as would be the case for a single ended design. Additionally, changing the bias current causes a proportional change in the slew rates of both the rising and the falling edges proportional to the change in bias current. This is desirable because it ensures that switching will occur around the same DC voltage for a wide range of bias currents and allows for greater range of delay since both edges are affected. In this embodiment, inactive side 80 is a replicate of the active side 70 with the differential pair receiving the same inputs on both the active side 70 and the inactive side 80. In one minor variation of this embodiment the differential pair on the inactive side has its gates coupled to its drains rather than receiving the inputs IN and INZ. This minor variation permits higher speed signaling because the capacitance seen by the input is reduced. However, it may also cause some variance in the load seen by the current steering circuit 60. It has been found that this embodiment and its variations are suitable for implementing a five stage VCO.

Figure 5:
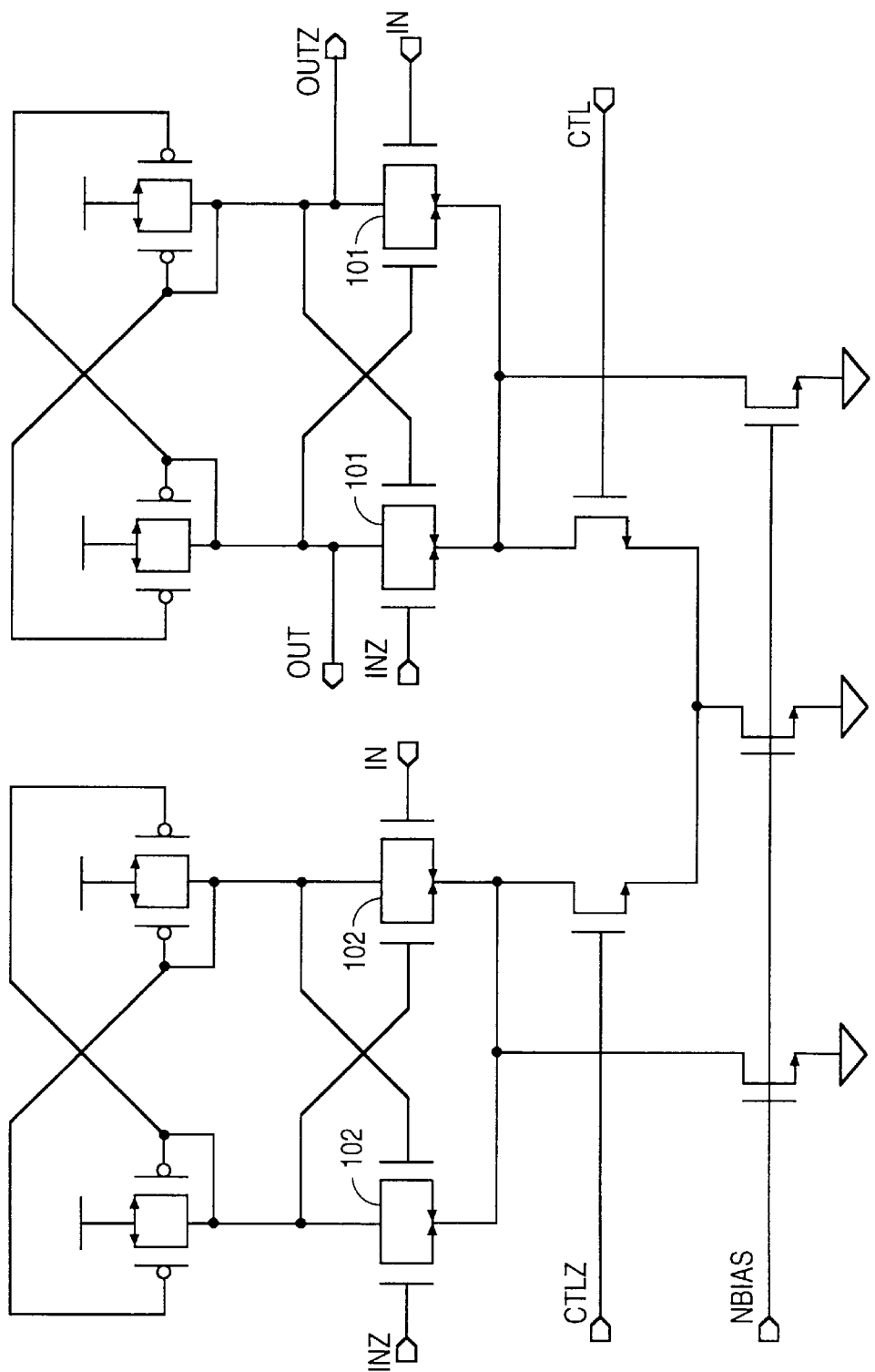
FIG. 5 is a schematic diagram of an alternative embodiment of the delay cell of FIG. 4.

FIG. 5 is a schematic diagram of an alternative embodiment of the delay cell of FIG. 3. This embodiment is the same as FIG. 4 except that the pair of weak transistors 101 are coupled source to source and drain to drain to the differential pair and have their gates cross coupled gate to drain. Similarly, the inactive side of the circuit has replicate weak transistors 102 coupled in the same configuration. One of ordinary skill in the art will understand that this modification increases the gain of the amplifier and provides some hysteresis. The added gain permits synthesis of a two stage VCO using this delay cell embodiment.

Figure 6:
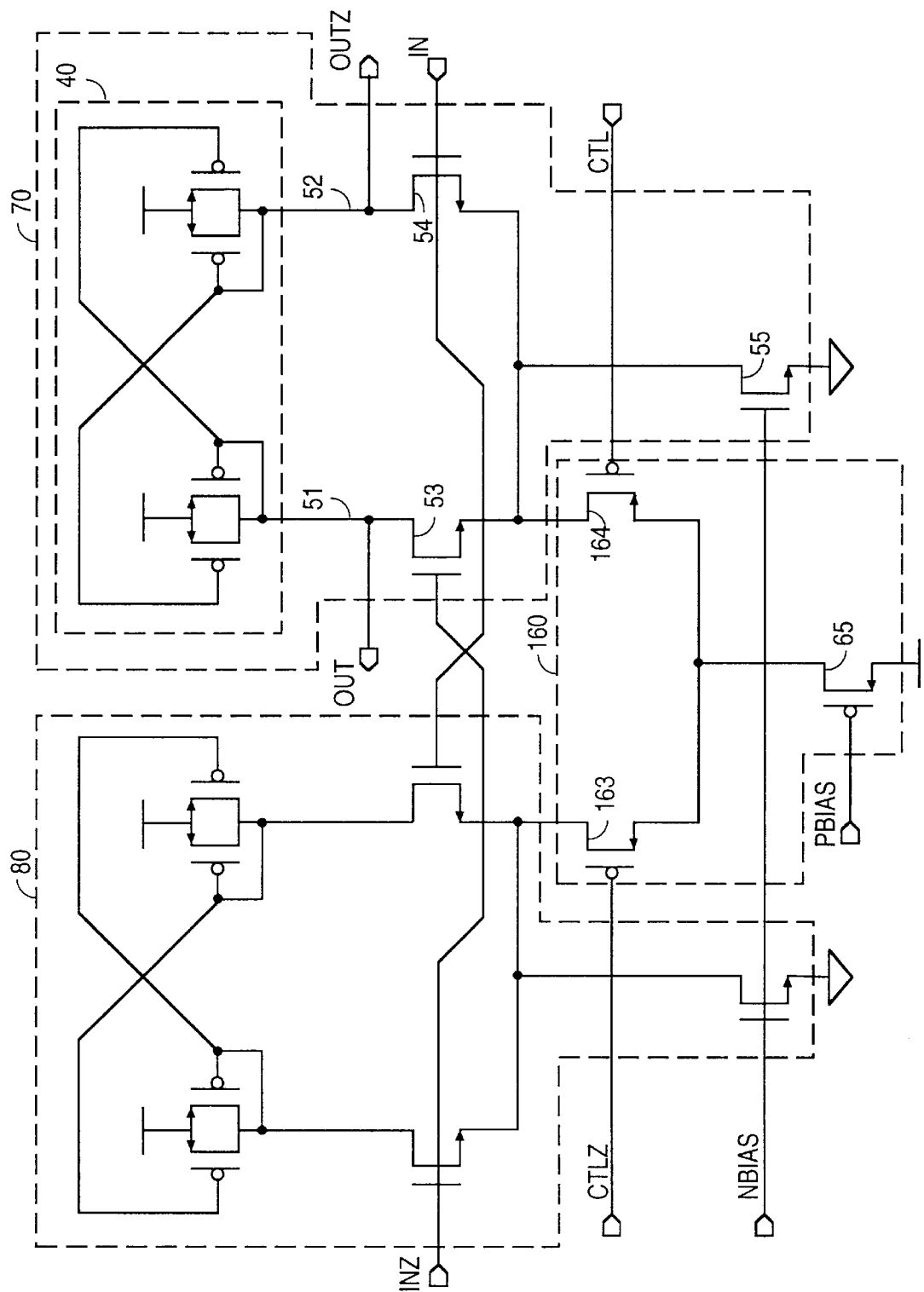
FIG. 6 is a schematic diagram of a delay cell of an alternate embodiment of the invention.

FIG. 6 is a schematic diagram of the delay cell of an alternative embodiment of the invention. As with FIG. 4, the delay cells is comprised of three major blocks: an active side 70 and an inactive side 80 and a current steering circuit 160. Current steering circuit 160 includes a differential pair 163, 164 p-type transistors and a p-type current source transistor 165. In this case, the current steering circuit rather than sinking current as was the case in FIG. 4, sources current responsive to the control inputs CTL and CTLZ. In this embodiment, NBIAS should be set so that the biasing transistors of the sides draw the maximum amount of current while maintaining the side in the saturation region. Thus, when the current steering circuit sources current to one side or the other, less current will be supplied by the respective side to achieve the total current drawn by the biasing transistor 55. A PBIAS current is generated to drive the gate of current source transistor 165 and should be selected such that current source transistor 165 and corresponding current steering circuit can source sufficient current to fill the current need of the corresponding biasing transistor 55 of the side to which current is sourced without driving that side out of the saturation region but should not be so much that insufficient current for oscillation is provided through the active delay stage 70 since most phase lock loop designs require oscillation to operate properly. All other features of the embodiment of FIG. 6 are the same as those shown and described with reference to FIG. 4.

Figure 7:
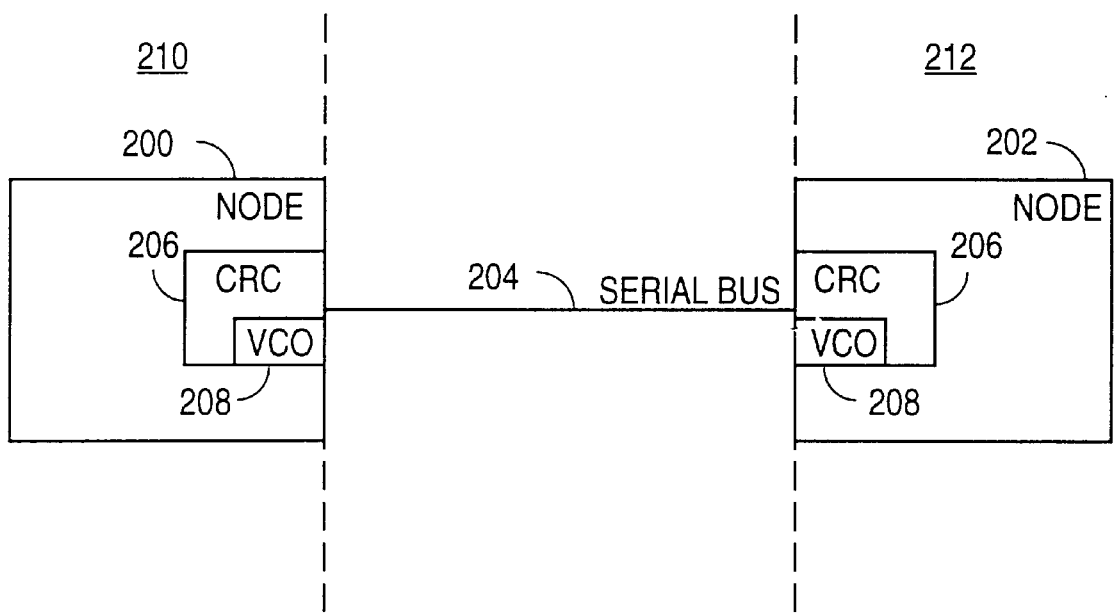
FIG. 7 is a block diagram of a system in which the variable delay cell of one embodiment of the invention might be employed.

FIG. 7 is a block diagram of a system in which the variable delay cell of one embodiment of the invention might be employed. The first node 200 is coupled to a serial bus 204 which in turn is coupled to a second node 202. The nodes 200 and 202 may be a general purpose computer and any other device to or from which data may flow. For example, node 200 might be a general purpose computer and node 202 might be a bulk storage device, eyeball camera or printer. This is not considered to be an exclusive list of what may constitute a node. The first node 200 exist in a first time domain 210 corresponding to its local dock. Similarly, the second node 202 operates in the second time domain 212 corresponding to its local clock. Thus, if node 202 clocks the data out onto the serial bus 204 to be received by the first node 200 the clock domains must be synchronized. Clock recovery circuit (CRC) (206) performs this function. A voltage controlled oscillator 208 used to implement the CRC 206 can itself be implemented using the delay cells of the embodiment so that the invention shown in FIGS. 4, 5 and 6. Accordingly, the delay cell is integrally important to the implementation of the CRC and as discussed above, the described embodiments permit very high speed operation.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An apparatus comprising:
   an active side including a self-biasing load coupled to a differential pair coupled to a first biasing transistor, the active side providing a differential output;
   an inactive side; and
   a current steering circuit coupled between the active side and the inactive side to steer an amount of current drawn through each side responsive to a differential control input.

2. The apparatus of claim 1 wherein the inactive side is a replicate of the active side.

3. The apparatus of claim 1 wherein the current steering circuit comprises:
   a second differential pair; and
   a current source transistor.

4. The apparatus of claim 1 wherein the self-biasing load comprises:
   a first and a second diode connected transistor; and
   a first and a second cross coupled transistor coupled source to source and drain to drain with the first and the second diode connected transistor respectively a gate of the first and second cross coupled transistor coupled to a gate of the second and the first diode connected transistor respectively.

5. The apparatus of claim 4 wherein all transistors of the load are p-type transistors.

6. The apparatus of claim 4 wherein all transistors of the load are n-type transistors.

7. The apparatus of claim 1 wherein the active side, the inactive side and the current steering circuit formed as part of an integrated circuit.

8. The apparatus of claim 3 wherein the inactive side is a replicate of the active side and wherein the first biasing transistor is biased to draw a minimum amount of current to retain the side in saturation.

9. The apparatus of claim 8 wherein current steering circuit acts as a voltage controlled current source drawing current from one of the active or inactive side responsive to the differential control input applied to the second differential pair.

10. The apparatus of claim 3 wherein the first biasing transistor is biased to draw a maximum amount of current while retaining the side in saturation.

11. The apparatus of claim 10 wherein the current steering circuit acts as a voltage controlled current source sourcing current to one of the active side or the inactive side responsive to the differential control input applied to the second differential pair.

12. A method comprising the steps of:

providing an active side and an inactive side of a delay cell, both sides having a self-biasing load; and steering current through one of the active side and the inactive side responsive to a differential control signal.

13. The method of claim 12 wherein the step of steering comprises:

biasing the active side to draw a minimum current to maintain the active side in saturation;

biasing a current steering circuit to draw a maximum current to maintain saturation in the active side; and switching the differential control signal at a gate of a differential pair of the steering circuit to draw current through one of the active side and the inactive side.

14. The method of claim 12 wherein the step of steering comprises:

biasing the active side to draw a maximum current to maintain the active side in saturation;

biasing a current steering circuit to source the maximum current; and switching the differential control signal at a gate of a differential pair of the steering circuit to source current to one of the active side and the inactive side.

15. A system comprising:

a serial bus;

a first node and a second node coupled to the serial bus, the first node operating in a first clock domain; and a clock recovery circuit (CRC) within the first node to synchronize the first clock domain with the second clock domain, the CRC comprising a variable delay cell having an active side an inactive side and a current steering circuit the current steering circuit coupled between the active side and the inactive side to steer an amount of current drawn through each side responsive to a differential control input.

16. The system of claim 15 wherein the current steering circuit comprises:

a second differential pair; and a current source transistor.

17. The system of claim 16 wherein the inactive side is a replicate of the active side.

18. The system of claim 17 wherein the active side comprises a self biasing load coupled to a differential pair coupled to a biasing transistor, the active side providing a differential output.

19. The system of claim 18 wherein its biasing transistor is biased to draw a maximum of current while retaining the side in saturation and wherein the current steering circuit acts as a voltage controlled current source, sourcing current to one of the active side and the inactive side responsive to the differential control input applied to the second differential pair.

20. The system of claim 18 wherein its biasing transistor is biased to draw a maximum of current while retaining the side in saturation and wherein the current steering circuit acts as a voltage controlled current source drawing current from one of the active or inactive side responsive to the differential control input applied to the second differential pair.

* * * * *